United States Patent
Nakada

(10) Patent No.: US 10,153,130 B2
(45) Date of Patent: Dec. 11, 2018

(54) CHARGED PARTICLE BEAM DRAWING APPARATUS AND CHARGED PARTICLE BEAM DRAWING METHOD

(71) Applicant: NUFLARE TECHNOLOGY, INC., Yokohama-shi (JP)

(72) Inventor: Sumito Nakada, Yokohama (JP)

(73) Assignee: NuFlare Technology, Inc., Yokohama-shi (JP)

( * ) Notice: Subject to any disclaimer, the term of this patent is extended or adjusted under 35 U.S.C. 154(b) by 88 days.

(21) Appl. No.: 14/966,521

(22) Filed: Dec. 11, 2015

(65) Prior Publication Data
US 2016/0181065 A1 Jun. 23, 2016

(30) Foreign Application Priority Data
Dec. 19, 2014 (JP) .................................. 2014-257024

(51) Int. Cl.
*H01J 37/317* (2006.01)
*H01J 37/304* (2006.01)

(52) U.S. Cl.
CPC ........ *H01J 37/3177* (2013.01); *H01J 37/304* (2013.01); *H01J 2237/30466* (2013.01); *H01J 2237/31793* (2013.01)

(58) Field of Classification Search
CPC .... H01J 37/244; H01J 37/304; H01J 37/3023; H01J 37/3174; H01J 37/3175; H01J 37/3177; H01J 2237/15; H01J 2237/30466; H01J 2237/31793
See application file for complete search history.

(56) References Cited

U.S. PATENT DOCUMENTS

| | | | | |
|---|---|---|---|---|
| 2003/0188289 A1* | 10/2003 | Koyama | ................. | G06F 17/50 716/55 |
| 2005/0151284 A1* | 7/2005 | Soeno | .................... | B82Y 10/00 264/1.33 |
| 2012/0164583 A1* | 6/2012 | Yamaguchi | ......... | H01J 37/3174 430/296 |

FOREIGN PATENT DOCUMENTS

| | | |
|---|---|---|
| JP | 2003-288496 A | 10/2003 |
| JP | 2014-41182 | 3/2014 |

OTHER PUBLICATIONS

Japanese Office Action dated May 29, 2018 in Japanese Patent Application No. 2014-257024 (with English translation), 7 pages.

* cited by examiner

*Primary Examiner* — David E Smith
*Assistant Examiner* — Hsien Tsai
(74) *Attorney, Agent, or Firm* — Oblon, McClelland, Maier & Neustadt, L.L.P.

(57) ABSTRACT

A charged particle beam drawing apparatus has a drawing unit including a charged particle source, a deflector and a stage on which a target object is placed, to perform drawing with a charged particle beam on a plurality of drawing regions on the target object, and a calculator to calculate a drawing progress ratio on the target object using a ratio of a drawn area of the drawing regions to a total area of the drawing regions.

18 Claims, 4 Drawing Sheets

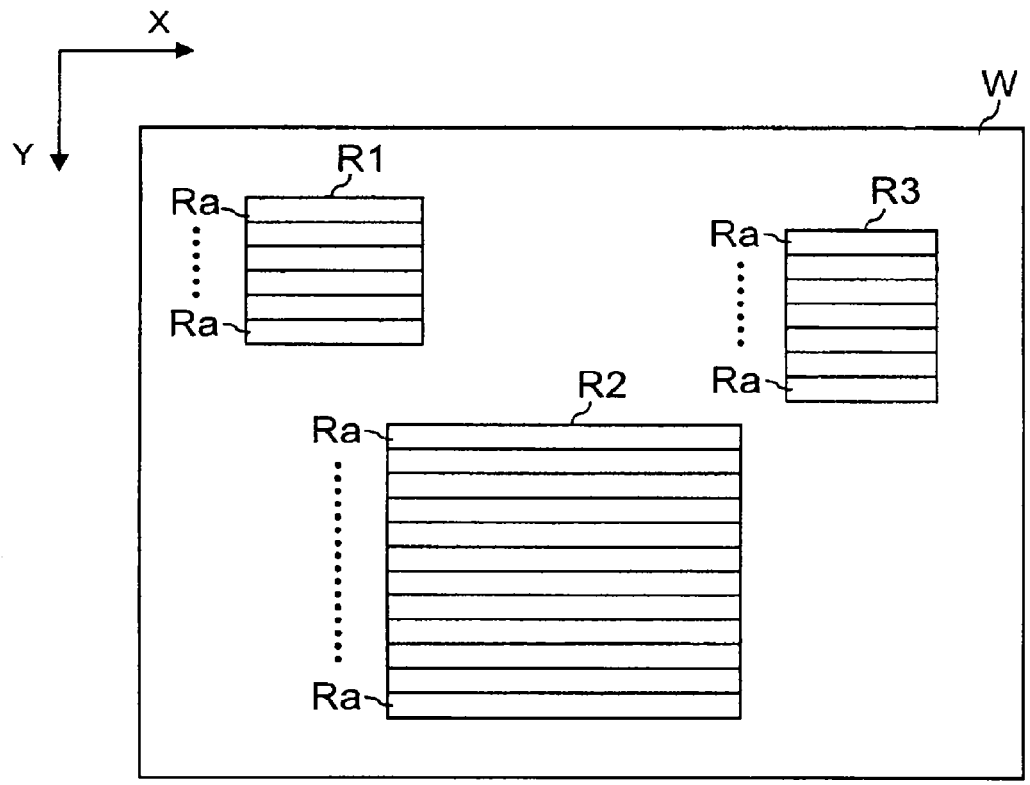
F I G. 2
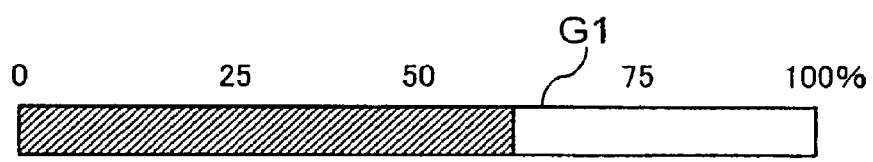
COLUMN: NUMBER OF DRAWN COLUMNS/TOTAL NUMBER OF COLUMNS
STRIPE: NUMBER OF DRAWN STRIPES/ TOTAL NUMBER OF STRIPES
F I G. 3

CHARGED PARTICLE BEAM DRAWING APPARATUS AND CHARGED PARTICLE BEAM DRAWING METHOD

CROSS REFERENCE TO RELATED APPLICATIONS

This application is based upon and claims the benefit of priority from the prior Japanese Patent Application No. 2014-257024, filed on Dec. 19, 2014, the entire contents of which are incorporated herein by reference.

FIELD

The present invention relates to a charged particle beam drawing apparatus and a charged particle beam drawing method.

BACKGROUND

In accordance with recent increase in integration and capacity of large scale integration (LSI) circuits, the widths of circuit lines required for semiconductor devices have become increasingly smaller. Lithography technique is used to form a desired circuit pattern on a semiconductor device, and pattern transfer using an original drawing pattern referred to as a mask (reticle) is performed in the lithography technique. In order to produce a high accuracy mask used in the pattern transfer, a charged particle beam drawing apparatus having excellent resolution is used.

The charged particle beam drawing apparatus is configured to divide each of a plurality of column regions designated on a target object, such as a mask, into a plurality of stripe regions (frame regions). The stripe regions are further divided into a number of sub-regions to generate shot data. The charged particle beam drawing apparatus then moves a stage on which the target object is mounted in a longitudinal direction of the stripe regions according to the generated shot data, while positioning a charged particle beam by main deflection on each sub-region and shooting the charged particle beam by sub-deflection to a predetermined position of the sub-region.

In such a charged particle beam drawing apparatus, total drawing time is necessary from several hours to several ten hours. In order to recognize the drawing status during the drawing, it is crucial to determine a drawing progress ratio. The drawing progress ratio is calculated using one of expressions including: an expression of dividing the number of drawn shots by an estimated number of shots, an expression of dividing the number of drawn stripes by an estimated number of stripes, and an expression of dividing the number of drawn columns by a total number of columns. The estimated number of shots and the estimated number of stripes are calculated before drawing, and the total column number is included in the drawing data. Herein, the number of shots refers to the number of shots (e.g., the number of figures) of the charged particle beam, the number of columns refers to the number of column regions, and the number of stripes refers to the number of stripe regions.

In practice, however, there is a case where part of data necessary for calculating the drawing progress ratio is not able to be obtained. For example, the estimated number of shots or the estimated number of stripes could be calculated before drawing, but such estimated data may not be acquired due to some reason (e.g., parameter errors or not supporting functions of an estimated data providing module). In this case, the drawing progress ratio is calculated using the total number of columns that can be obtained without fail.

However, the drawing time of the column regions largely differs for each column region. For example, the drawing time of a first column region may be 30 seconds, while the drawing time of a second column region may be 3 hours. In this case, if the drawing progress ratio is calculated by one of the above-described expressions, i.e., the number of drawn columns divided by the total number of columns, the drawing progress ratio is not updated during or until the end of the drawing of the second column region. A resulting drawing progress ratio is significantly different from the actual drawing progress ratio. It is, therefore, desired to obtain a correct drawing progress ratio.

BRIEF DESCRIPTION OF THE DRAWINGS

FIG. 2 is an explanatory view illustrating column regions and stripe regions on a target object according to the embodiment;

FIG. 3 is a display example of a drawing progress ratio according to the embodiment;

DETAILED DESCRIPTION

Figure 1:
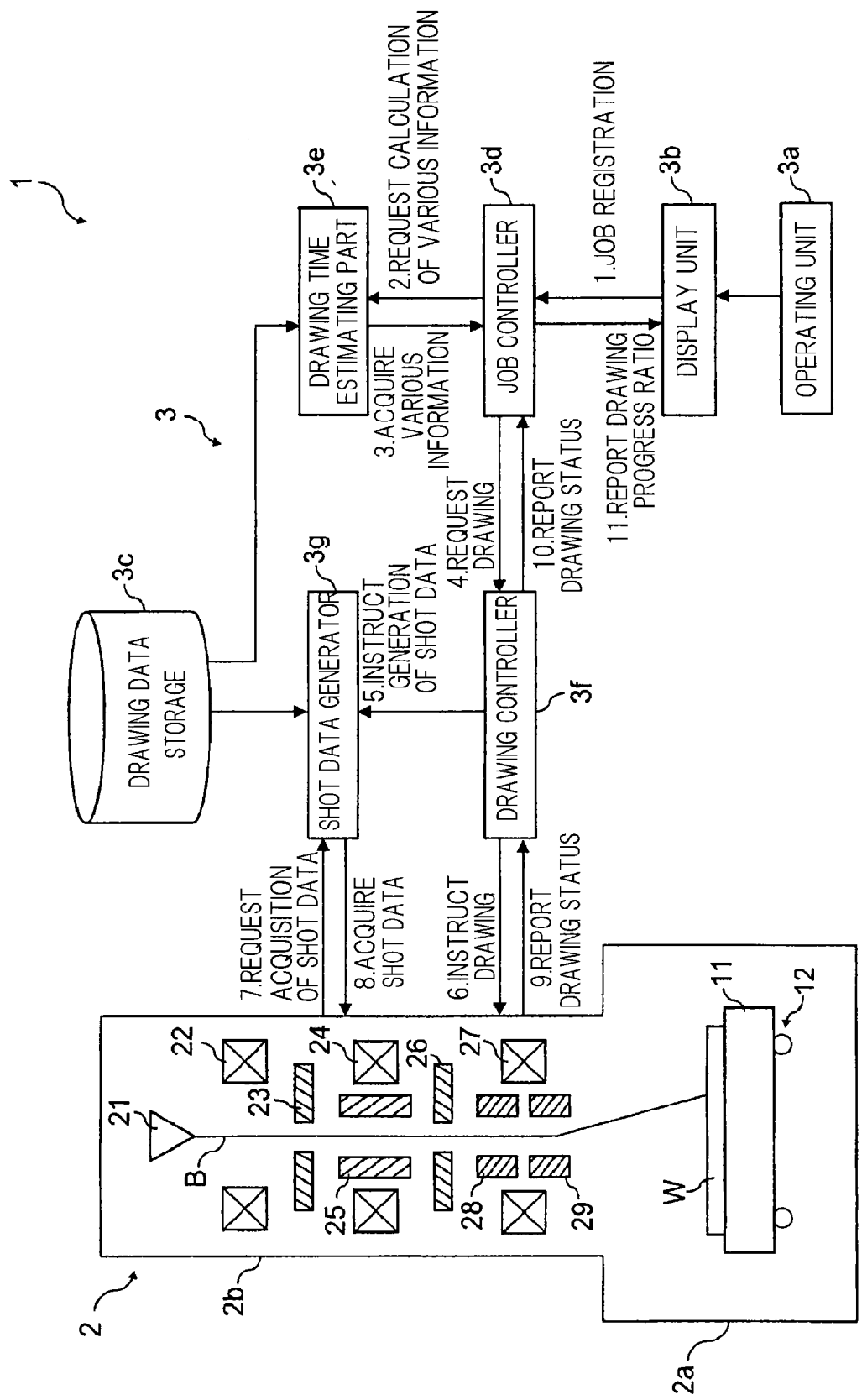
FIG. 1 is a schematic diagram illustrating the structure of a charged particle beam drawing apparatus according to an embodiment.

According to one embodiment, a charged particle beam drawing apparatus has a drawing unit including a charged particle source, a deflector and a stage on which a target object is placed, to perform drawing with a charged particle beam on a plurality of drawing regions on the target object, and a calculator to calculate a drawing progress ratio on the target object using a ratio of a drawn area of the drawing regions to a total area of the drawing regions.

An embodiment will be described by referring to the accompanying drawings.

As illustrated in FIG. 1, a charged particle beam drawing apparatus 1 according to the embodiment is provided as an example of a variable shaping type drawing apparatus using electron beam B as a charged particle beam. The charged particle beam drawing apparatus 1 includes a drawing unit 2 in which drawing is performed with the electron beam B, and a control unit (control circuitry) 3 that controls the drawing unit 2. The charged particle beam is not limited to the electron beam B, and other charged particle beams, such as ion beam may be used.

The drawing unit 2 includes a drawing chamber (drawing room) 2a that stores a target object or "a sample" W which is subject to drawing, and an optical lens barrel 2b connected to the drawing chamber 2a. Furthermore, the drawing unit 2 includes a charged particle source (an ejection unit 21), a deflector 25 and a stage 11 on which a target object is placed to perform drawing with a charged particle beam on a plurality of drawing regions on the target object. The optical lens barrel 2b is provided on the upper surface of the drawing chamber 2a. The optical lens barrel 2b forms and deflects the electron beam B by an electronic optical system (which is an example of the charged particle optical system) to irradiates the target object W in the drawing chamber 2a.

The drawing chamber 2a and the optical lens barrel 2b are airtight, and the internal pressures thereof are reduced to the vacuum state.

In the drawing chamber 2a, a stage 11, on which the target object W such as a mask or a blank is supported, and a stage moving mechanism 12 for moving the stage 11 are provided. The stage moving mechanism 12 moves the stage 11 in an X-axis direction and a Y-axis direction (hereinafter simply referred to as X-direction and Y-direction) which run perpendicularly to each other in a horizontal plane.

The optical lens barrel 2b includes an ejection unit 21, such as an electron gun that ejects the electron beam B, a lighting lens 22 that collects the electron beam B, a first shaping aperture 23 for shaping the beam, a projection lens 24 for projection, a shaping deflector 25 for shaping the beam, a second shaping aperture 26 for shaping the beam, an objective lens 27 that focuses the beam on the target object W, and a sub-deflector 28 and a main deflector 29, both of which are provided to control shot positions of the beam on the target object W. These elements constitute an electronic optical system.

In the drawing unit 2, the electron beam B is ejected from the ejection unit 21 to irradiate the first shaping aperture 23 by the lighting lens 22. The first shaping aperture 23 has, for example, a rectangular opening. Therefore, when the electron beam B passes through the first shaping aperture 23, the cross-section of the electron beam B is shaped into a rectangle and the electron beam B is projected to the second shaping aperture 26 by the projection lens 24. The projecting position can be deflected by the shaping deflector 25, and by changing the projecting position, it is possible to control the shape and size of the electron beam B. After that, the electron beam B having passed through the second shaping aperture 26 is focused on and ejected to the target object W on the stage 11 by the objective lens 27. At this time, the shot position of the electron beam B on the target object W on the stage 11 is changeable by the sub-deflector 28 and the main deflector 29.

The control unit 3 includes an operating unit 3a operated by a user for input operation, a display unit 3b that displays various information, a drawing data storage 3c that stores drawing data, a job controller 3d that controls the entire drawing operation, a drawing time estimating part 3e that calculates estimated drawing time or the like related to the drawing, a drawing controller 3f that controls the drawing unit 2, and a shot data generator 3g that generates shot data. Each part inside of the control unit (control circuitry) 3 described above may be configured by hardware, such as an electric circuitry, a quantum circuitry, a circuit substrate, computer, or by software, such as a program that executes various functions, or by a combination thereof.

The operating unit 3a is an input part operated by the user for input operation and receives various input operations, such as job registration and layout change. The operating unit 3a may be implemented by an input device, such as a mouse or a keyboard. For example, the user may operate the operating unit 3a to specify the drawing data to be used.

The display unit 3b is a display device that displays various images, such as various information or an operation screen (e.g., a graphical user interface (GUI) that receives various instructions from the operator). The display unit 3b may be implemented by a display such as a liquid crystal display or an electroluminescence (EL) display. For example, the display unit 3b functioning as the GUI informs the job controller 3d of job registration in response to a designated operation of the operating unit 3a by the user regarding the drawing data (see "1. JOB REGISTRATION" in FIG. 1).

The drawing data storage 3c is a storage that stores the drawing data. The drawing data is design data (layout data) created by the designer or the like of the semiconductor integrated circuit, and converted into the format for the charged particle beam drawing apparatus 1. Such data is input from an external apparatus to the drawing data storage 3c and stored therein. The drawing data storage 3c may be implemented, for example, by a hard disc drive (HDD) or a solid state drive (SSD).

The job controller 3d is a main controller for controlling various parts of the apparatus. The job controller 3d may send, as one of controlling operations, an instruction to calculate various information regarding the registered drawing data to the drawing time estimating part 3e in response to the input operation to the operating unit 3a by the operator (see "2. INSTRUCT CALCULATION OF VARIOUS INFORMATION" in FIG. 1). The job controller 3d then acquires the various information. After acquisition of the various information, the job controller 3d sends a drawing request to the drawing controller 3f (see "4. REQUEST DRAWING" in FIG. 1).

The drawing time estimating part 3e calculates, according to the calculation instruction sent from the job controller 3d, various information (e.g., the estimated drawing time, the estimated number of stripes, the estimated number of shots, the area of drawing region, and so on) and send them to the job controller 3d (see "3. ACQUIRE VARIOUS INFORMATION" in FIG. 1). The estimated number of stripes, the estimated number of shots, and so on will be described in detail later.

The drawing controller 3f sends, according to the drawing request from the job controller 3d, an instruction to generate shot data to the shot data generator 3g (see "5. INSTRUCT GENERATION OF SHOT DATA" in FIG. 1). After that, the drawing controller 3f sends a drawing instruction to the drawing unit 2 (see "6. INSTRUCT DRAWING" in FIG. 1). The drawing controller 3f mainly performs the control operation associated with drawing in the drawing unit 2.

The shot data generator 3g divides, according to the shot data generation instruction from the drawing controller 3f, column regions R1, R2, and R3, which are drawing regions provided according to the drawing data, individually into stripe-shaped (narrow rectangular shaped) stripe regions (frame regions) Ra, as illustrated (as an example) in FIG. 2. The shot data generator 3g divides each of the stripe regions Ra into a lot of matrix-shaped sub-regions (block regions), and then determines the shape, size, position, and the like of figures in each sub-region to generate the shot data.

It is assumed herein that the longitudinal direction of the stripe regions Ra is indicated by the X-direction, and the short-length direction is indicated by the Y-direction. A length of the short-length direction (Y-direction) of the stripe regions Ra is set to a length capable of deflecting the electron beam B by main deflection. The stripe region Ra is an example of the unit drawing region in dividing the column regions R1, R2, and R3. The column regions may be referred to as the columns and the stripe regions may be referred to as the stripes hereinafter.

By referring to FIG. 1 again, the drawing unit 2 sends a request for acquisition of the shot data to the shot data generator 3g (see "7. REQUEST ACQUISITION OF SHOT DATA" in FIG. 1), and acquires the shot data from the shot data generator 3g (see "8. ACQUIRE SHOT DATA" in FIG.

1). The drawing unit 2 performs drawing based on the shot data acquired from the shot data generator 3g.

Specifically, the drawing unit 2 moves the stage 11 in the longitudinal direction (X-direction) of the stripe regions Ra by the stage moving mechanism 12 according to the acquired shot data. At the same time, the drawing unit 2 positions the electron beam B in each sub-region by the main deflector 29 and shoots the electron beam B to the predetermined position of the sub-region by the sub-deflector 28 to draw figures. Upon completion of the drawing of a stripe region Ra, the stage 11 is moved in the Y-direction, and the drawing of the next stripe region Ra is performed. This procedure is repeated until the entire regions of the column regions R1, R2, and R3 of the target object W are drawn with the electron beam B (example of drawing operation). Since the stage 11 is continuously moved in one direction during the drawing, the original of the drawing in the sub-region is tracked by the main deflector 29 such that the original of the drawing can follow the movement of the stage 11.

Although the stage 11 is moved continuously in the X-direction in the first embodiment, it is not limited thereto. Alternatively, the drawing may be performed in a step-and-repeat method in which the drawing of a sub-region is performed while the stage 11 stops, and the drawing is skipped when the stage 11 is moved to the next sub-region.

During the drawing operation described above, the job controller 3d acquires drawing status information (e.g., the current number of drawn columns, the current number of drawn stripes, the current number of drawn shots, and so on) from the drawing unit 2 via the drawing controller 3f (see "9. REPORT DRAWING STATUS" and "10. REPORT DRAWING STATUS" in FIG. 1). The job controller 3d then calculates a drawing progress ratio using the acquired drawing status information and the various information (e.g., the estimated drawing time, the estimated number of stripes, the estimated number of shots, the area of the drawing region, and so on) acquired from the drawing time estimating part 3e. Thus, the job controller 3d functions as a calculator that calculates the drawing progress ratio. The job controller 3d may not acquire the estimated number of stripes or the estimated number of shots.

When the acquiring of the estimated number of shots has succeeded, the job controller 3d calculates a drawing progress ratio P1 by an equation 1: drawing progress ratio P1 (%)=(a value of dividing number of drawn shots by estimated number of shots)×100. On the other hand, if the estimated number of stripes is acquired instead of the estimated number of shots, the drawing progress ratio is calculated by the equation 2: drawing progress ratio P2 (%)=(a value of dividing number of drawn stripes by estimated number of stripes)×100.

In the case where both the estimated number of shots and the estimated number of stripes are not able to be acquired, a drawing progress ratio P3 is calculated by the equation 3 below. The number of shots refers to the number of shots of the electron beam B (e.g., the number of figures), and the number of stripes refers to the number of stripe regions Ra.

$$P3(\%) = \frac{\sum_{k=1}^{n-1} A_k + A_n\left(\frac{m_n}{M_n}\right)}{\sum_{k=1}^{N} A_k} \times 100$$

In the equation 3, n represents the number of a column that is being drawn (the number of drawn columns+1), N represents the total number of columns, $m_k$ represents the number of drawn stripes in the kth column, $M_k$ represents the total number of stripes in the kth column, and $A_k$ represents the area of the kth column. $A_k$ and N can be acquired before the drawing, and $M_k$ can be acquired at the beginning of drawing each column. If k is equal to n, $m_n$ represents the number of drawn stripes in the nth column, i.e., the column that is being drawn. $M_n$ also represents the total number of stripes in the column being drawn, and $A_n$ is also the area of the column being drawn.

The drawing progress ratio P3 is obtained by the equation 3 above: (the total drawn area up to the column located immediately before the column being drawn+the drawn area of the column being drawn)/the total area of all columns. The drawn area of the column being drawn is represented by: the area of the column being drawn×(the number of drawn stripes in the column being drawn/the total number of stripes in the column being drawn. The number of stripes in the equation 3 may be replaced by the number of shots. In this case, it is possible to update the drawing progress ratio more frequently compared to the case where the number of stripes is used. The drawing progress ratio can thus be calculated more accurately.

In the above, the equation 1 is used in preference to the equation 2. In this case, the drawing progress ratio can be updated more frequently compared to the case where the equation 2 is used. The drawing progress ratio can thus be calculated more accurately. The preference level is not limited to the above, and the equation 2 or the equation 3, for example, may be used in preference to the equation 1.

Subsequently, the job controller 3d sends the calculated drawing progress ratio to the display unit 3b (see "11. REPORT DRAWING PROGRESS RATIO" in FIG. 1). The display unit 3b displays the drawing progress ratio sent from the job controller 3d in real time. For example, as illustrated (as an example) in FIG. 3, the display screen of the display unit 3b displays an image G1 representing the drawing progress ratio. Under the image G1, the drawing progress ratio of the columns, i.e., the number of drawn columns divided by the total number of columns, or the drawing progress ratio of stripes, i.e., the number of drawn stripes divided by the total number of stripes, and so on are displayed. The user can visually recognize the drawing progress ratio to recognize the drawing status.

Next, the drawing processing (including the calculation processing of the drawing progress ratio) performed by the above-described charged particle beam drawing apparatus 1 will be described by referring to FIGS. 4 and 5.

Figure 4:
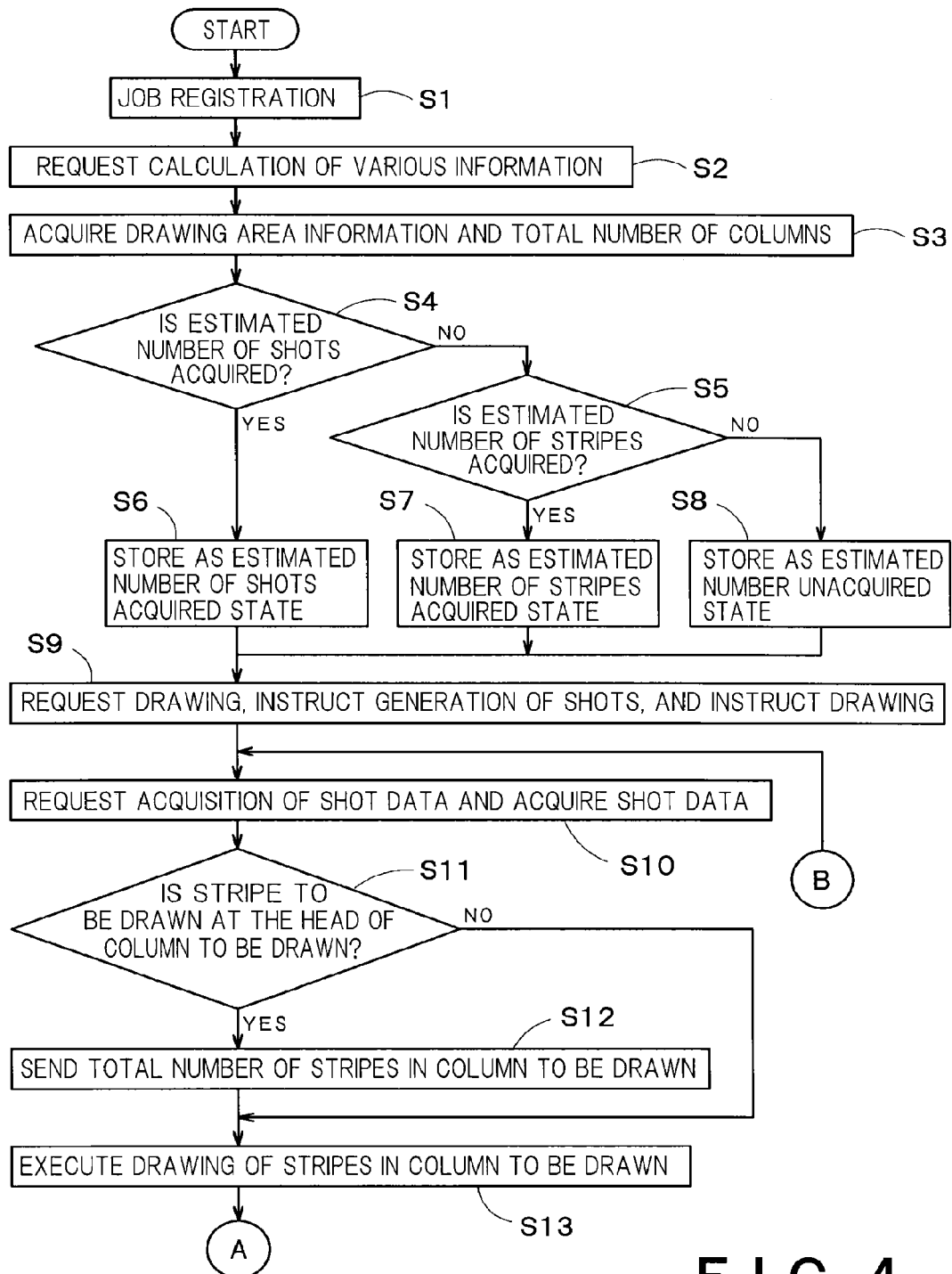
FIG. 4 is a flowchart illustrating part of drawing processing (including calculation and display processing of the drawing progress ratio) according to the embodiment.

As illustrated in FIG. 4, job registration is performed in response to the input operation of the operating unit 3a by the user (see step S1 in FIG. 4, and "1. JOB REGISTRATION" in FIG. 1). According to the job registration, the job controller 3d sends a request for calculation of various information to the drawing time estimating part 3e (see step S2 in FIG. 4, and "2. REQUEST CALCULATION OF VARIOUS INFORMATION" in FIG. 1). Upon receiving the request for calculation, the drawing time estimating part 3e calculates the drawing area and the total number of columns as the various information. Further, the drawing time estimating part 3e calculates the estimated number of shots or the estimated number of stripes, if possible. The job controller 3d acquires the drawing area information and the total number of columns as the various information from the drawing time estimating part 3e (see step S3 in FIG. 4, and "3. ACQUIRE VARIOUS INFORMATION" in FIG. 1). At this time, the estimated number of shots or the estimated number of stripes is also acquired as the various information, if acquirable.

Subsequently, it is determined whether the estimated number of shots or the estimated number of stripes is acquired (steps S4 and S5). If it is determined that the estimated number of shots is acquired (YES at step S4), the acquired state is stored as an estimated number of shots acquired state (step S6). On the other hand, if it is determined that the estimated number of stripes is acquired (YES at step S5), the acquired state is stored as an estimated number of stripes acquired state (step S7). If it is determined that both the estimated number of shots and the estimated number of stripes are not acquired (NO at steps S4 and S5), the acquired state is stored as an estimated number unacquired state (step S8).

After that, the request for drawing is sent to the drawing controller 3f from the job controller 3d, the instruction of generating shot data is sent from the drawing controller 3f to the shot data generator 3g, and the drawing instruction is sent from the drawing controller 3f to the drawing unit 2 (see step S9 in FIG. 4, and "4. REQUEST DRAWING", "5. INSTRUCT GENERATION OF SHOT DATA", and "6. INSTRUCT DRAWING" in FIG. 1). In addition, the request for acquiring the shot data is sent from the drawing unit 2 to the shot data generator 3g such that the shot data is acquired from the shot data generator 3g by the drawing unit 2 (see step S10 in FIG. 4, and "7. REQUEST FOR SHOT DATA" and "8. ACQUIRE SHOT DATA" in FIG. 1).

Then, it is determined whether the stripe to be drawn is located at the head of the column to be drawn (step S11). If it is determined that the stripe to be drawn is located at the head of the column to be drawn (YES at step S11), the total number of stripes in the column to be drawn is sent to the drawing unit 2 from the shot data generator 3g (step S12), and the drawing of the stripes in the column to be drawn is performed (step S13). Meanwhile, if the stripe to be drawn is not located at the head of the column to be drawn (NO at step S11), the drawing of the stripes is started (step S13).

Figure 5:
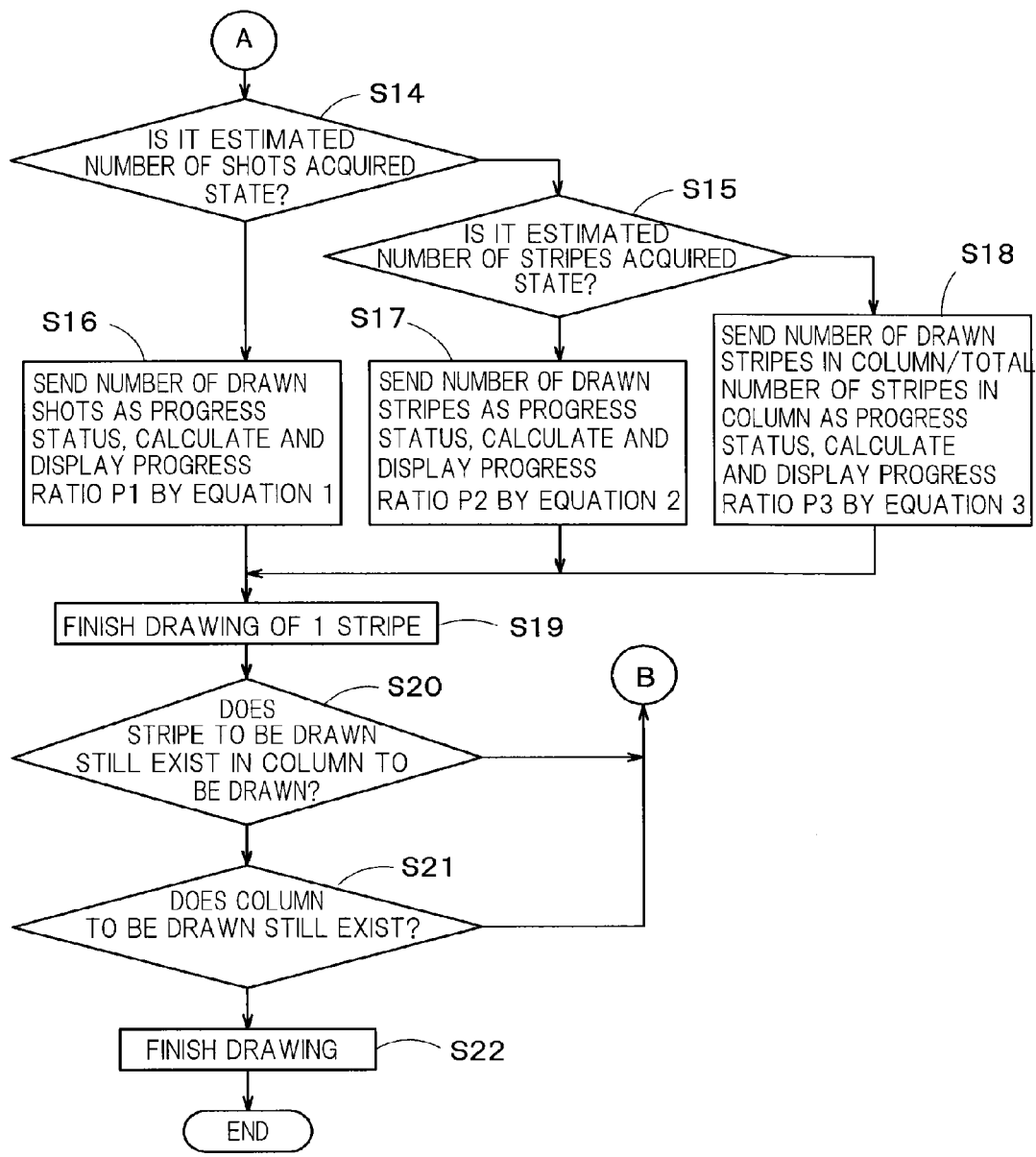
FIG. 5 is a flowchart illustrating part of drawing processing (including calculation and display processing of the drawing progress ratio) according to the embodiment.

Next, as illustrated in FIG. 5, it is determined whether the acquired state is the estimated number of shots acquired state or the estimated number of stripes acquired state (steps S14 and S15). If it is determined that the acquired state is the estimated number of shots acquired state (YES at step S14), the number of the drawn shots is sent to the job controller 3d from the drawing unit 2 via the drawing controller 3f. The drawing progress ratio P1 is determined by the equation 1 above, and the drawing progress ratio P1 is displayed by the display unit 3b (step S16 in FIG. 5, and "9. REPORT DRAWING STATUS", "10. REPORT DRAWING STATUS", and "11. REPORT DRAWING PROGRESS RATIO" in FIG. 1). The estimated number of shots is acquired from the drawing time estimating part 3e.

Meanwhile, if the acquired state is the estimated number of stripes acquired state (YES at step S15), the number of drawn stripes is sent as the progress status from the drawing unit 2 to the job controller 3d via the drawing controller 3f. The drawing progress ratio P2 is determined by the equation 2 above, and the drawing progress ratio P2 is displayed by the display unit 3b (see step S17 in FIG. 5, and "9. REPORT DRAWING STATUS", "10. REPORT DRAWING STATUS", and "11. REPORT DRAWING PROGRESS RATIO" in FIG. 1). The estimated number of stripes is acquired from the drawing time estimating part 3e.

If it is determined that the acquired state is neither the estimated shot acquired state nor the estimated number of stripes acquired state (NO at steps S14 and S15), the number of drawn stripes in the column divided by the total number of stripes in the column is sent as the progress status from the drawing unit 2 to the job controller 3d via the drawing controller 3f. The drawing progress ratio P3 is determined by the equation 3 above, and the drawing progress ratio P3 is displayed by the display unit 3b (see step S18 in FIG. 5, and "9. REPORT DRAWING STATUS", "10. REPORT DRAWING STATUS", and "11. REPORT DRAWING PROGRESS RATIO" in FIG. 1). The area of each column as the drawing area information, the total column number, or the like is acquired by the drawing time estimating part 3e.

After that, the drawing of one stripe is finished (step S19), and it is determined whether the stripes to be drawn exist in the column to be drawn (step S20). If it is determined that the stripes to be drawn exists in the column to be drawn (YES at step S20), the process returns to step S10 and is repeated from step S10. Meanwhile, if it is determined that no stripes to be drawn exist in the column to be drawn (NO at step S20), it is determined whether the column to be drawn still exists (step S21). If it is determined that the column to be drawn still exists (YES at step S21), the process returns to step S10 and is repeated from step S10. Meanwhile, if it is determined that no column to be drawn exists (NO at step S21), the drawing is finished (step S22).

According to such drawing processing, the drawing progress ratio P1 is calculated using the equation 1 above when the estimated number of shots is acquired. If the estimated number of shots is not acquired and the estimated number of stripes is acquired, the drawing progress ratio P2 is calculated using the equation 2 above. When both the estimated number of shots and the estimated number of stripes have not been acquired, the drawing progress ratio P3 is calculated using the equation 3 above.

In calculation of the equation 3, the drawing progress ratio P3 is obtained using the total number of stripes and the number of drawn stripes in the column, as well as the total area and the total number of columns that have been acquired previously. Since the drawing progress ratio changes according to the drawn area of the columns, the drawing progress ratio is updated constantly even while the drawing continues in the column. This can eliminate no change of the drawing progress ratio during the drawing in the column as in the past example, and suppress deviation of the drawing progress ratio from the actual drawing progress ratio. Thus, a correct drawing progress ratio can be obtained.

If the drawing progress ratio in the column is not updated nor changed during drawing, for example, the user might feel that the drawing is interrupted. The user may check various settings and status of the apparatus, or otherwise forcefully end drawing if the drawing progress ratio does not change for a long time. In contrast, according to the drawing processing described above, the drawing progress ratio changes according to the drawn area of the column, the drawing progress ratio is updated and changes constantly even when the drawing proceeds in the column. Thus, the user can correctly recognize the drawing status. The user would not feel interruption of the drawing, and it is possible to prevent various confirmations or forceful finish.

As described above, according to the present embodiment, the drawing progress ratio P3 is calculated using the ratio of the drawn area of the drawing region (e.g., the column region R1, R2, or R3) to the area of the drawing region drawn by the drawing unit 2. The drawing progress ratio changes according to the drawn area of the drawing region, such that the drawing progress ratio is updated and changed continuously even when the drawing proceeds in the drawing region. This can eliminate no change of the drawing progress ratio during the drawing of the drawing region as in the past example, and suppress deviation of the drawing progress ratio from the actual drawing progress ratio. Thus, a correct drawing progress ratio can be obtained and improvement of displaying accuracy of the progress can be realized.

Specifically, the drawing region (e.g., the column region R1, R2, or R3) is divided into the plurality of unit drawing regions (e.g., the stripe regions Ra), and the drawing is performed for each unit drawing region. The drawn area of the drawing region is calculated using the ratio of the number of the drawn unit drawing regions having been drawn by the drawing unit 2 to the total number of the unit drawing regions. Alternatively, the ratio of the number of the shots of the electron beam B (e.g., the number of figures) executed by the drawing unit 2 to a predetermined total number of shots of the electron beam B may be used. Further, the area of the drawing region being drawn is used to calculate the drawn area of the drawing region. Thus, it is possible to determine the drawn area of the drawing region according to the progress of drawing of the drawing region.

If there is the plurality of drawing regions (e.g., three column regions R1, R2, and R3) on the target object W, the drawn area of the drawing region being drawn is added to the total drawn area of the drawing regions up to the drawing region immediately (one drawing region) before the current drawing region being drawn. A resulting added value is used to provide a ratio of the total area of the drawing regions. With the ratio, the drawing progress ratio is calculated. As a result, the drawing progress ratio can be determined correctly even when more than one drawing region is present.

When multiple drawing in which the drawing is repeated many times for the unit drawing region (e.g., the stripe region Ra) is performed, an equation 4 below is used in place of the equation 3 above to calculate a drawing progress ratio P4. The stripe regions are partitioned regions.

$$P4(\%) = \frac{\sum_{k=1}^{n-1} r_k \times A_k + r_n \times A_n \left(\frac{m_n}{M_n}\right)}{\sum_{k=1}^{N} r_k \times A_k} \times 100$$

In the equation, $r_n$ represents a level of multiplicity. For example, $r_n$ equals to 2 when the drawing is performed twice, and $r_n$ equals to 3 when the drawing is performed three times. Considering $r_n$ is not always necessary, but it is possible to obtain a more accurate drawing progress ratio by considering the multiplicity $r_n$, and to further improve the display accuracy of the progress.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A charged particle beam drawing apparatus, comprising:
 a drawing unit including a charged particle source, a deflector and a stage on which a target object is placed, to perform drawing with a charged particle beam on a plurality of drawing regions on the target object; and
 a calculator to calculate a drawing progress ratio on the target object using a ratio of a drawn area of the drawing regions to a total area of the drawing regions,
 wherein the calculator determines whether an estimated number of the drawing regions and an estimated number of shots of the charged particle beam are acquired, and
 when it is determined that both the estimated number of the drawing regions and the estimated number of shots of the charged particle beam are not acquired, the calculator calculates the drawing progress ratio using the ratio of the drawn area of the drawing regions to the total area of the drawing regions.

2. The charged particle beam drawing apparatus according to claim 1, wherein
 the total area of the drawing regions is a sum of a total area of drawn regions of the drawing regions and a drawn area of a drawing region that is being drawn.

3. The charged particle beam drawing apparatus according to claim 1, wherein
 when it is determined that the estimated number of the drawing regions and the estimated number of shots of the charged particle beam are acquired, the calculator calculates the drawing progress ratio based on a ratio of the number of drawn shots to the estimated number of shots.

4. The charged particle beam drawing apparatus according to claim 1, wherein
 when it is determined that both the estimated number of the drawing regions and the estimated number of shots of the charged particle beam are not acquired, the calculator determines whether an estimated number of stripes is acquired to draw a plurality of stripe regions divided in stripe shape from each of the drawing regions, and
 when it is determined that the estimated number of stripes is not acquired, the calculator calculates the drawing progress ratio using the ratio of the drawn area of the drawing regions to the total area of the drawing regions.

5. The charged particle beam drawing apparatus according to claim 4, wherein
 the drawing unit performs drawing by dividing each of the drawing regions into a plurality of columns and dividing each column into the stripes, and
 when it is determined that the estimated number of stripes is not acquired, the calculator calculates a sum of the total area of drawn columns up to a column immediately before a column that is being drawn and a drawn area of the column being drawn, and calculates the drawing progress ratio using a ratio of the sum to the total number of columns of the drawing regions.

6. The charged particle beam drawing apparatus according to claim 5, wherein
 the drawn area of the column being drawn equals to a value acquired by multiplying the area of the column being drawn by a ratio of the total number of stripes in the column being drawn to the number of drawn stripes in the column being drawn.

7. The charged particle beam drawing apparatus according to claim 5, wherein
 the drawing unit draws the stripes sequentially one after another in the column for each of the columns, and the calculator calculates the drawing progress ratio for each stripe in the column.

8. The charged particle beam drawing apparatus according to claim 4, wherein
when it is determined that the estimated number of stripes is acquired, the calculator calculates the drawing progress ratio based on the ratio of the number of drawn stripes to the estimated number of stripes.

9. The charged particle beam drawing apparatus according to claim 1, further comprising:
a display to display the drawing progress ratio calculated by the calculator.

10. A charged particle beam drawing method, comprising:
drawing with a charged particle beam on a plurality of drawing regions on a target object;
calculating a drawing progress ratio on the target object using a ratio of a drawn area of the drawing regions to a total area of the drawing regions,
determining whether an estimated number of the drawing regions and an estimated number of shots of the charged particle beam are acquired, and
calculating the drawing progress ratio using the ratio of the drawn area of the drawing regions to the total area of the drawing regions, when it is determined that both the estimated number of the drawing regions and the estimated number of shots of the charged particle beam are not acquired.

11. The charged particle beam drawing method according to claim 10, wherein
the total area of the drawing regions is a sum of a total area of drawn regions of the drawing regions and a drawn area of a drawing region that is being drawn.

12. The charged particle beam drawing method according to claim 10, further comprising:
calculating the drawing progress ratio based on a ratio of the number of drawn shots to the estimated number of shots when it is determined that the estimated number of the drawing regions and the estimated number of shots of the charged particle beam are acquired.

13. The charged particle beam drawing method according to claim 10, further comprising:
determining whether an estimated number of stripes is acquired to draw a plurality of stripe regions divided in stripe shape from each of the drawing regions when it is determined that both the estimated number of the drawing regions and the estimated number of shots of the charged particle beam are not acquired, and
calculating the drawing progress ratio using the ratio of the drawn area of the drawing regions to the total area of the drawing regions when it is determined that the estimated number of stripes is not acquired.

14. The charged particle beam drawing method according to claim 13, further comprising:
dividing each of the drawing regions into a plurality of columns and each column is divided into the stripes for drawing, and,
calculating a sum of the total area of drawn columns up to a column immediately before a column that is being drawn and a drawn area of the column being drawn, when it is determined that the estimated number of stripes is not acquired, and calculating the drawing progress ratio using a ratio of the sum to the total number of columns of the drawing regions.

15. The charged particle beam drawing method according to claim 14, wherein
the drawn area of the column being drawn equals to a value acquired by multiplying the area of the column being drawn by a ratio of the total number of stripes in the column being drawn to the number of drawn stripes in the column being drawn.

16. The charged particle beam drawing method according to claim 14, further comprising:
drawing the stripes sequentially one after another in the column for each of the columns, and
calculating the drawing progress ratio or each stripe in the column.

17. The charged particle beam drawing method according to claim 13, further comprising:
calculating the drawing progress ratio based on the ratio of the number of drawn stripes to the estimated number of stripes, when it is determined that the estimated number of stripes is acquired.

18. The charged particle beam drawing method according to claim 10, further comprising:
displaying the drawing progress ratio calculated by the calculator.

* * * * *